(12) United States Patent
Liu

(10) Patent No.: US 6,320,900 B1
(45) Date of Patent: Nov. 20, 2001

(54) METHODS AND ARRANGEMENTS FOR TRANSMITTING HIGH SPEED DATA OVER REDUCED BANDWIDTH COMMUNICATION RESOURCES

(75) Inventor: Ce Richard Liu, Sugarland, TX (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/183,613

(22) Filed: Oct. 30, 1998

(51) Int. Cl.$^7$ ................................ H04B 1/38; H03M 7/12
(52) U.S. Cl. .................................................. 375/219; 341/69
(58) Field of Search .................................. 375/219, 259, 375/257, 377, 316, 295, 222, 211; 341/70, 68, 69

(56) References Cited

U.S. PATENT DOCUMENTS

| | | | |
|---|---|---|---|
| 4,606,051 | 8/1986 | Crabtree et al. | 375/86 |
| 4,718,074 | * 1/1988 | Mannas et al. | 375/371 |
| 5,347,225 | 9/1994 | Graham | 324/523 |
| 5,365,515 | 11/1994 | Graham | 370/17 |
| 5,379,005 | 1/1995 | Aden et al. | 333/24 |
| 5,422,919 | 6/1995 | Graham | 375/200 |
| 5,450,594 | 9/1995 | Aden et al. | 395/200.06 |
| 5,467,061 | 11/1995 | Aden et al. | 333/24 R |
| 5,550,506 | 8/1996 | Tsumura | 329/304 |
| 5,587,692 | 12/1996 | Graham et al. | 333/12 |
| 5,696,790 | 12/1997 | Graham et al. | 375/238 |
| 5,726,650 | * 3/1998 | Yeoh et al. | 341/70 |
| 5,870,214 | * 2/1999 | Knowles | 359/152 |

OTHER PUBLICATIONS

Texas Instruments; "Implementing a π/4 Shift D–QPSK Baseband Modem Using the TMS320C50"; Sep. 1996; pp. 1–40.

3Com Corp. website, Robyn Aber; "xDSL Supercharges Copper"; Mar. 1997; pp.1–5.

Tut Systems website; "Simply delivering xDSL . . . connecting the local loop to the campus, the high rise and throughout the home."; website update Nov. 3, 1997; pp. 1–6.

Zona Research, Inc.; "Compaq Hits Homerun with Tut"; Aug. 11, 1998; pp. 1–2.

* cited by examiner

Primary Examiner—Chi Pham
Assistant Examiner—Khai Tran
(74) Attorney, Agent, or Firm—Conley, Rose & Tayon, P.C.

(57) ABSTRACT

Methods and arrangements are provided that allow for data communications between a plurality of devices over a reduced bandwidth communication medium, such as, for example, a twisted pair wire as used in many home environments for telephone access. The methods and arrangements advantageously reduce the necessary bandwidth required for a data communication by eliminating the need to transmit encoded data, such as Manchester encoded data between devices. Thus, for example, Ethernet configured data that is encoded and output by a network interface within a sending device/appliance is intercepted, decoded, transmitted over a reduced bandwidth communication medium, and then re-encoded and re-transmitted or otherwise supplied to the network interface within the receiving device/appliance. For Manchester encoded data signals associated, for example, with a 10 BASE-T Ethernet network, the encoded data signal has a data rate that is twice that of the decoded data signal. Therefore, using the methods and arrangements of the present invention, an intercepted 20 Mbps Manchester encoded data signal is decoded to a corresponding 10 Mbps data signal, modulated using an RF carrier, transmitted for limited distances over a twisted pair wire, demodulated to a baseband frequency, re-encoded to a 20 Mbps Manchester encoded data signal, and then provided to the receiving device.

17 Claims, 3 Drawing Sheets

METHODS AND ARRANGEMENTS FOR TRANSMITTING HIGH SPEED DATA OVER REDUCED BANDWIDTH COMMUNICATION RESOURCES

FIELD OF THE INVENTION

The present invention relates to data communications, and more particularly, to methods and arrangements for advantageously reducing the data transmission rate between networked devices, without the loss of pertinent data, thereby allowing the networked devices to be interconnected through communications resources having reduced bandwidths.

BACKGROUND OF THE INVENTION

In the future, it is expected that homes will have several computing devices and other data-dependent appliances that will need to be interconnected or networked together. These "computing resources" will be configured to exchange information with one another in the form of data that is transmitted over one or more communications resources within the home environment. To allow for such networking within the home environment, cost effective communication resources need to be developed.

Baseband Ethernet technology is currently being employed in many business environments to provide similar networking capabilities between current computing resources. For example, a baseband Ethernet technology known as 10 BASE-T Ethernet is becoming common because it provides a fairly high data rate and utilizes twisted pair wires, similar to those used for telephones, rather than coaxial cables to interconnect the computing resources.

The electrical and operational configuration of a 10 BASE-T network is specified by the Institute for Electrical and Electronic Engineers (IEEE) 802.3 standard. A 10 BASE-T network provides a 10 megabit per second (Mbps) data channel between computing resources. In accordance with the IEEE 802.3 standard, a Carrier Sense, Multiple Access with Collision Detection (CSMA/CD) protocol is employed to allow the computing resources to utilize the shared communications resource, in this case two twisted pair wires (i.e., one twisted pair for transmitting and one twisted pair for receiving).

A 10 BASE-T network employs conventional baseband transmission techniques, and as such does not require a carrier signal or additional modulation. The data in the 10 Mbps channel is, however, Manchester encoded prior to transmission through the twisted pair wire to embed timing information within the transmitted data signal. Thus, each of the computing resources typically includes a network interface circuit or card (NIC) that provides the necessary Manchester encoding and decoding capability.

As a result of the Manchester encoding, however, the actual data transmission rate associated with the 10 Mbps channel is essentially doubled to 20 Mbps. Therefore, it is necessary that the communication media or resource (e.g., twisted pair wire) be capable of providing at least 20 Mbps bandwidth to effectively carry the Manchester encoded data. The traditional twisted pair wiring that is installed in most homes for use with the telephone is not shielded and/or designed to carry 20 Mbps of digital data, and as such typically cannot provide this needed bandwidth. Thus, bringing 10 BASE-T networking to a home environment usually requires an investment in new, higher-bandwidth rated, twisted pair wiring (e.g., shielded). For many home-owners this cost will be prohibitive. Additionally, many homes have only one twisted pair wire installed, rather than the required two twisted pair wires.

Some other proposed solutions for home networking include standard modem technology and digital subscriber line (xDSL) technology. These technologies are directed towards providing external connectivity through existing telephone and related data communication services, as well as potentially providing limited internal home networking. One of the problems associated with standard modem technology, however, is that it is currently limited to data speeds of about 56 kbps and often requires very complicated circuitry. Although, XDSL technology can transmit data at a much higher rate than standard modem technology, for example, up to about 4 Mbps, the cost of implementing such is very high and typically requires very complicated modulation methods.

There are technologies and products that are directed more towards home networking. For example, Tut Systems Inc., of Pleasant Hill, Calif., produces a HR1300T communication device. The HR1300T uses a "time modulation line code" to provide an in-home network over existing phone lines. However, this modulation scheme currently only provides about a 1 to 2 Mbps data rate.

Therefore, as can be appreciated, there is a need to provide improved methods and arrangements that allow standard home wiring, or other inexpensive or existing communication media, to be used as a communication resource between computing resources that are pre-configured or subsequently configured to connect to a network, such as, for example, an Ethernet network. Preferably, the methods and arrangements not only provide the necessary bandwidth, but are also cost effective, essentially transparent to the user/computing resource, and simple to implement.

SUMMARY OF THE INVENTION

In accordance with certain aspects of the present invention, methods and arrangements are provided that allow reduced bandwidth communication media to be used as a communication resource between computing resources that are configured to communicate through a higher bandwidth media using encoded data. In accordance with other aspects of the present invention, the methods and arrangements provide a cost effective networking capability that is, essentially transparent to the user/computing resource, and simple to implement within existing structures.

By way of example, in accordance with certain aspects of the present invention, a standard Ethernet data signal having an data rate of 20 megabits per second (Mbps) when encoded can be transmitted at a significantly lower data rate, for limited distances over existing telephone wiring, by decoding the signal and retransmitting the decoded signal using different modulation techniques.

Thus, in accordance with certain embodiments of the present invention, a network arrangement is provided. The network arrangement includes a first device, a decoder, a transmitter, a data communication medium, a receiver, an encoder, and a second device. The first device is configured to output encoded data that is to be sent to the second device. The encoded data is provided to the decoder, which outputs corresponding decoded data. The decoded data is then provided to the transmitter, which is configured to transmit the decoded data over the data communication medium. The receiver is configured to receive the decoded data over the data communication medium and output the decoded data to the encoder. The encoder regenerates the encoded data from the decoded data and provides the encoded data to the second device.

With this in mind, in accordance with still further embodiments of the present invention, the encoded data includes return-to-zero (RTZ) data, while the decoded data includes non-return-to-zero (NRZ) data. For example, in certain embodiments, wherein the RTZ data includes Manchester encoded data, the decoder is configured to convert the RTZ data into NRZ data, while the encoder is configured to convert the NRZ data into the RTZ data. In accordance with such embodiments, the transmitter is configured to modulate NRZ data, and the receiver is configured to demodulate NRZ data.

The above stated needs and others are also met by an interface arrangement for use in connecting a computing resource with a data communication medium, in accordance with further embodiments of the present invention. The interface arrangement includes a first encoder/decoder that is configured to receive outgoing non-return-to-zero (NRZ) data from the computing resource and convert the outgoing NRZ data to outgoing return-to-zero (RTZ) data, a second encoder/decoder that is configured to receive the outgoing RTZ data from the first encoder/decoder and reconvert the outgoing RTZ data into the outgoing NRZ data, and a transceiver that is configured to receive the outgoing NRZ data from the second encoder/decoder and transmit the outgoing NRZ data over the data communication medium. For example, in accordance with certain other embodiments, the transceiver is also configured to receive incoming non-return-to-zero (NRZ) data over the data communication medium and output the incoming NRZ data, the second encoder/decoder is further configured to receive the incoming NRZ data from the transceiver, convert the incoming NRZ data to incoming return-to-zero (RTZ) data and output the incoming RTZ data, and the first encoder/decoder is configured to receive the incoming RTZ data from the second encoder/decoder, reconvert the incoming RTZ data into the incoming NRZ data and output the incoming NRZ data to the computing resource. In still further embodiments the incoming and outgoing RTZ data includes Manchester encoded data and has a first data rate, while the incoming and outgoing NRZ data have a second data rate that is less than the first data rate.

In accordance with yet another embodiment of the present invention, a method for transferring information from a first device to a second device over a data communication medium is provided. The method includes receiving information from the first device as encoded data, decoding the encoded data to produce decoded data, transmitting the decoded data via the data communication medium, receiving the decoded data via the data communication medium, and then regenerating the decoded data, encoding the decoded data to reproduce the encoded data and providing the encoded data to the second device. In certain additional embodiments, the encoded data may include return-to-zero (RTZ) data, the step of decoding the encoded data can further include converting the RTZ data to non-return-to-zero (NRZ) data, and the step of encoding the decoded data can further include converting the NRZ data to the RTZ data.

BRIEF DESCRIPTION OF THE DRAWINGS

A more complete understanding of the present invention may be had by reference to the following Detailed Description and appended claims when taken in conjunction with the accompanying Drawings wherein:

DETAILED DESCRIPTION

Figure 1:
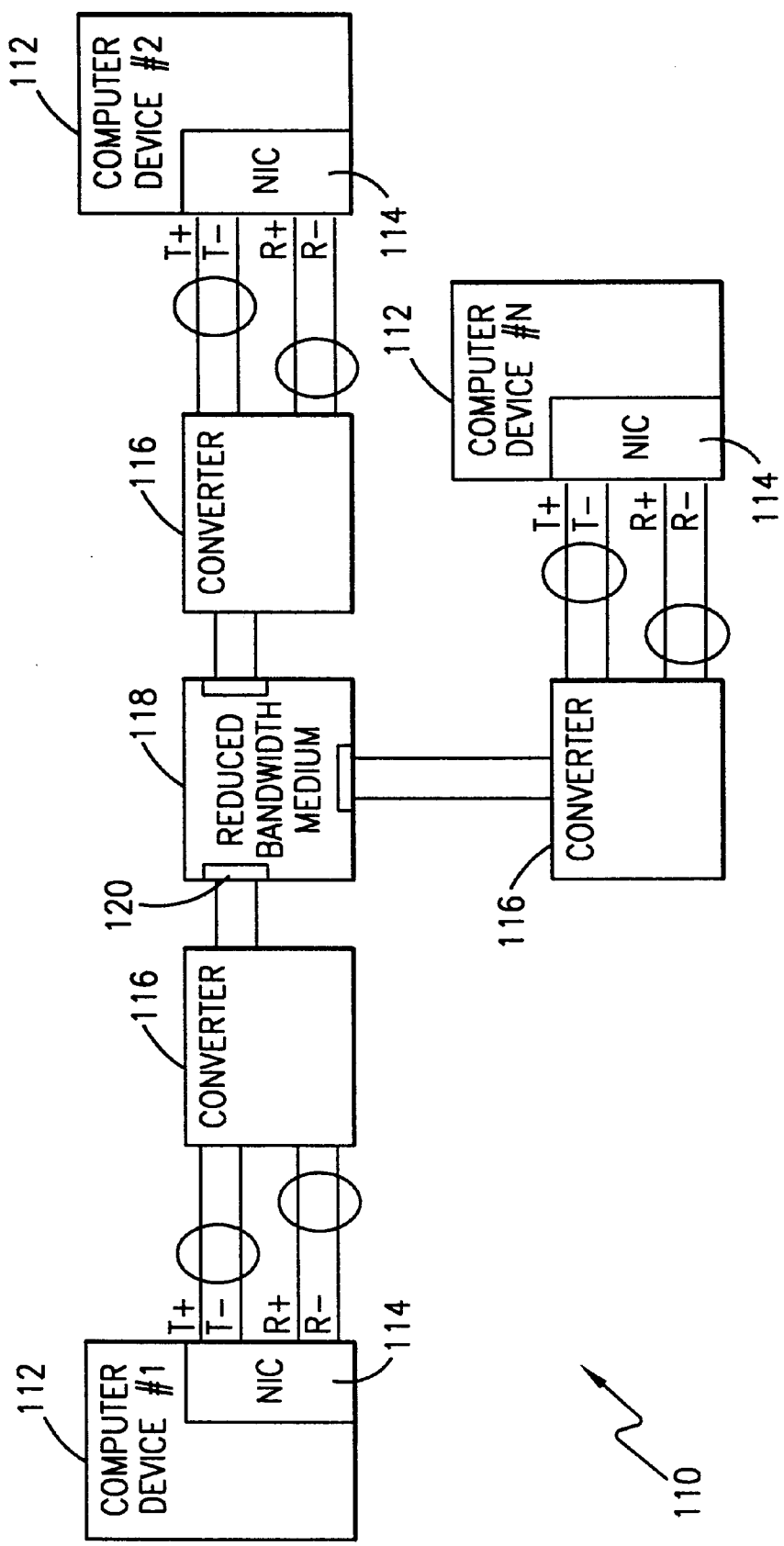
FIG. 1 is a block diagram depicting a home environment having a plurality of computing resources that are networked together through converters and a reduced bandwidth communication resource, in accordance with certain embodiments of the present invention.

FIG. 1 is a block diagram depicting an exemplary home environment 110 having several computing resources, such as devices 112 (numbered 1 through N), that are networked together through converters 116 and a reduced bandwidth medium 118, in accordance with certain embodiments of the present invention.

Each device 112 is configured to exchange data (i.e., send and/or receive data) with one or more other devices 112. By way of example, devices 112 can include computers, servers, and related peripheral devices such as storage devices, external communication devices, output devices, printing devices, and the like. Devices 112 are not limited to traditional computing devices and can also include other appliances that are capable of exchanging data, including control/status data, with one or more other devices.

As shown in FIG. 1, devices 112 include a network interface circuit or card (NIC)114 that allows devices 112 to be networked through a defined high bandwidth communication medium (not shown). For example, NIC 114 can be a standard 10 BASE-T NIC that provides data communication over two higher bandwidth, typically shielded, twisted-pair wires. The first twisted pair wire, with wires labeled T+ and T−, is used for transmitting "outgoing" differential data signals. The second twisted pair wire, with wires labeled R+ and R−, is used for receiving "incoming" differential data signals. A 10 BASE-T Ethernet network provides up to about 10 Mbps of data communication between devices 112. Because the IEEE 802.3 standard requires that the incoming and outgoing data be Manchester encoded, however, the actual data rate over the twisted pair wires of a 10 BASE-T network is doubled and, therefore, can be as high as about 20 Mbps.

Rather than require a higher bandwidth medium, in accordance with certain embodiments of the present invention, a converter 116 is arranged between NIC 114 to provide an essentially seamless interface that advantageously allows for the use of a reduced bandwidth medium 118.

During a data transmission, converter 116 significantly reduces the data rate of the outgoing encoded data from NIC 114 by receiving the outgoing encoded data, decoding the outgoing encoded data, and subsequently re-transmitting outgoing decoded data over reduced bandwidth medium 118 to one or more other converters 116.

As depicted in FIG. 1, converter 116 is connected to reduced bandwidth medium 118 through a conventional telephone connection 120 (e.g., a RJ45 connector).

Upon receiving the incoming decoded data, converter 116 essentially regenerates the original encoded data by re-encoding the incoming decoded data and then re-transmitting, albeit over a short distance, the resulting incoming encoded data to the associated NIC 114.

In this manner, devices 112 are allowed to exchange data seemingly in accordance with a prescribed standard, such as 10 BASE-T Ethernet, over a reduced bandwidth communication medium 118 that typically would not provide the necessary bandwidth and/or requisite number of conductors for such data communications.

Reduced bandwidth medium 118 can include any common home wiring, such as, for example, twisted pair wires. Since many home environments 110 already have at least one twisted pair wire available for telephone use, in accordance with certain exemplary embodiments of the present invention, reduced bandwidth medium 118 includes a single twisted pair wire.

In accordance with other embodiments of the present invention, reduced bandwidth medium 118 can include other wiring, fiber and/or cabling of the type typically found in home environment 110.

In accordance with still further embodiments of the present invention, reduced bandwidth medium 118 can also include multiple communication mediums/techniques. For example, the decoded data can be transmitted through home environment 110 by converter 116 (or other network devices within reduced bandwidth medium 118) using radio frequency (RF), microwave, infrared, and other conventional electromagnetic spectrum transmission techniques.

A more detailed description of an exemplary converter 116 is given herein below with reference to FIG. 2.

In accordance with certain aspects of the present invention, it is preferred that converter 116 operate seamless with respect to each device 112, and in particular with respect to NIC 114. In other words, the data communication between devices 112 appears to each device and corresponding NIC 114 to be 10 BASE-T Ethernet compliant as would be a conventional 10 BASE-T Ethernet local area network (LAN).

Figure 2:
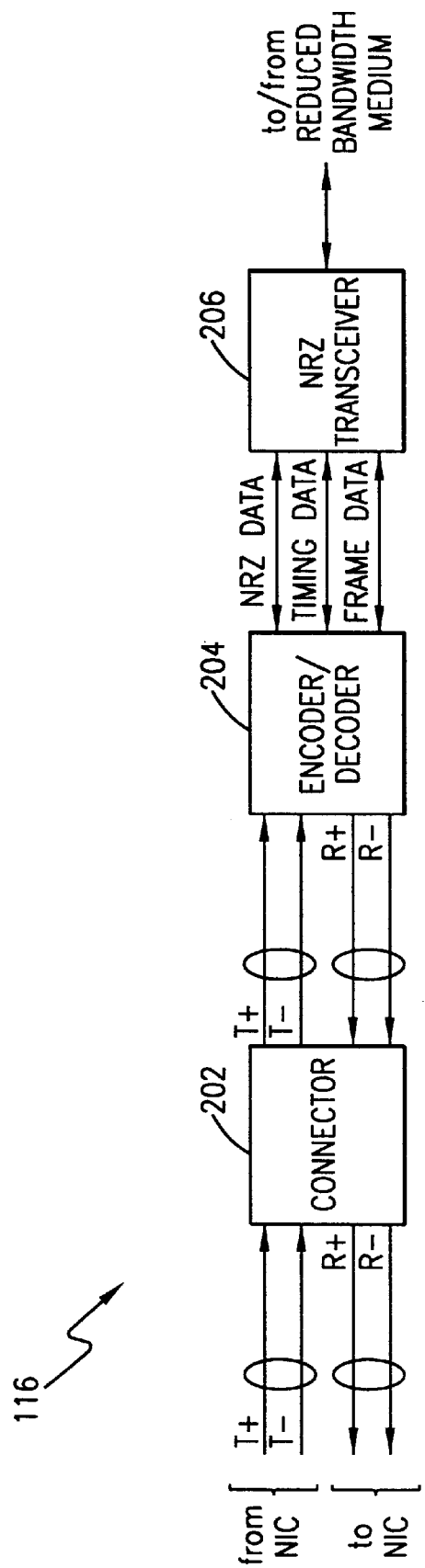
FIG. 2 depicts a block diagram of a converter, for example, as employed in the exemplary home environment of FIG. 1, in accordance with certain embodiments of the present invention.

As shown in the block diagram of FIG. 2, converter 116 includes a connector 202, an encoder/decoder 204 and a non-return-to-zero (NRZ) transceiver 206.

Connector 202, which is optional, provides a modular interface to NIC 116 through conventional twisted pair wire/telephone connectors and jacks. Connector 202 essentially passes electrical signals between NIC 114 and encoder/decoder 204 without intentionally altering the electrical signals.

Encoder/decoder 204 is configured to receive outgoing encoded data from NIC 114. By way of example, in a 10 BASE-T NIC the outgoing encoded data is Manchester encoded and transmitted over twisted pair wire T+ and T− (e.g., see FIG. 1).

As a result of the Manchester encoding process, the outgoing encoded data received by converter 116 from NIC 114 includes return-to-zero (RTZ) formatted digital data having an increased data rate, for example, 20 Mbps rather than its original 10 Mbps data rate. While the effective data rate is increased as a result of the Manchester encoding, the amount of device-related information contained within the encoded data has not increased.

Within encoder/decoder 204, the outgoing encoded data is decoded using an appropriate decoding scheme. By way of example, if the encoded data includes Manchester encoded data (i.e., RTZ data), then a Manchester decoding scheme is employed within encoder/decoder 204 to regenerate the original NRZ data as provided by device 112 to NIC 114.

Those skilled in the art will recognize that encoding and decoding schemes/circuitry, such as Manchester encoders/decoders, are well known and readily available. For example, Fujitsu Microelectronics of San Jose, Calif. supplies several Ethernet related Manchester encoding/decoding circuits, including a MB86961/MB86961A interface for 10 BASE-T Ethernet. In accordance with certain embodiments of the present invention, a MB86961/MB86961A interface is configured as encoder/decoder 204.

After the outgoing encoded data has been decoded within encoder/decoder 204, the resulting outgoing decoded data, which includes NRZ data, is provided to NRZ transceiver 206 for transmission over reduced bandwidth medium 118.

In certain exemplary embodiments of the present invention, additional timing, frame, and/or carrier detection data that is derived/extracted from the outgoing encoded data within encoder/decoder 204 is also provided to NRZ transceiver 206 where it can be used to control the transmission of the outgoing decoded data through reduced bandwidth medium 118. For example, the MB86961/MB86961A interface outputs a received clock (RCLK) signal that can be used as the transmitter clock for the transmission of the outgoing decoded data over reduced bandwidth medium 118. Further, when the MB86961/MB86961A interface is set to mode 1, as is preferred in certain embodiments of the present invention, positive frame information is made available on the carrier detection (CD) output pin. As can be appreciated, such frame information can also be used to facilitate the transmission of the outgoing decoded data over reduced bandwidth medium 118.

The outgoing decoded data and (if applicable) the related timing and/or frame data from encoder/decoder 204 are then provided to NRZ transceiver 206. NRZ transceiver 206 is configured to transmit at least the outgoing decoded data over reduced bandwidth medium 118 to at lest one other converter 116. Those skilled in the art will recognize that NRZ transceiver 206 can take on several different embodiments, depending upon the configuration/type of reduced bandwidth medium 118. Thus, for example, NRZ transceiver 206 in certain exemplary embodiments is capable of modulating the outgoing decoded data to a carrier frequency or frequencies using different modulation techniques. By way of further example, NRZ transceiver 206 can employ phase modulation, frequency modulation, and/or amplitude modulation techniques.

Before discussing the further exemplary embodiment of FIG. 3, below, it is also important to recognize that converter 116 in FIG. 2 is also configured to receive incoming decoded data (e.g., NRZ data) from other converters 116 through reduced bandwidth medium 118.

Thus, referring to FIG. 2 once again, NRZ transceiver 206 is also configured to demodulate the incoming decoded data. Once demodulated, the incoming decoded data is then provided to encoder/decoder 204, wherein the incoming decoded data is encoded (e.g., Manchester encoded) to regenerate the original RTZ data as output by the sending NIC 114. This regenerated incoming encoded data is then provided by encoder/decoder 204 over twisted pair wire (e.g., see R+ and R− in FIG. 1) to NIC 114, for example, through connector 202.

In certain embodiments, related timing data and/or frame data can also be derived/output by NRZ transceiver 206 to encoder/decoder 204 to further facilitate the regeneration of the incoming encoded data.

Figure 3:
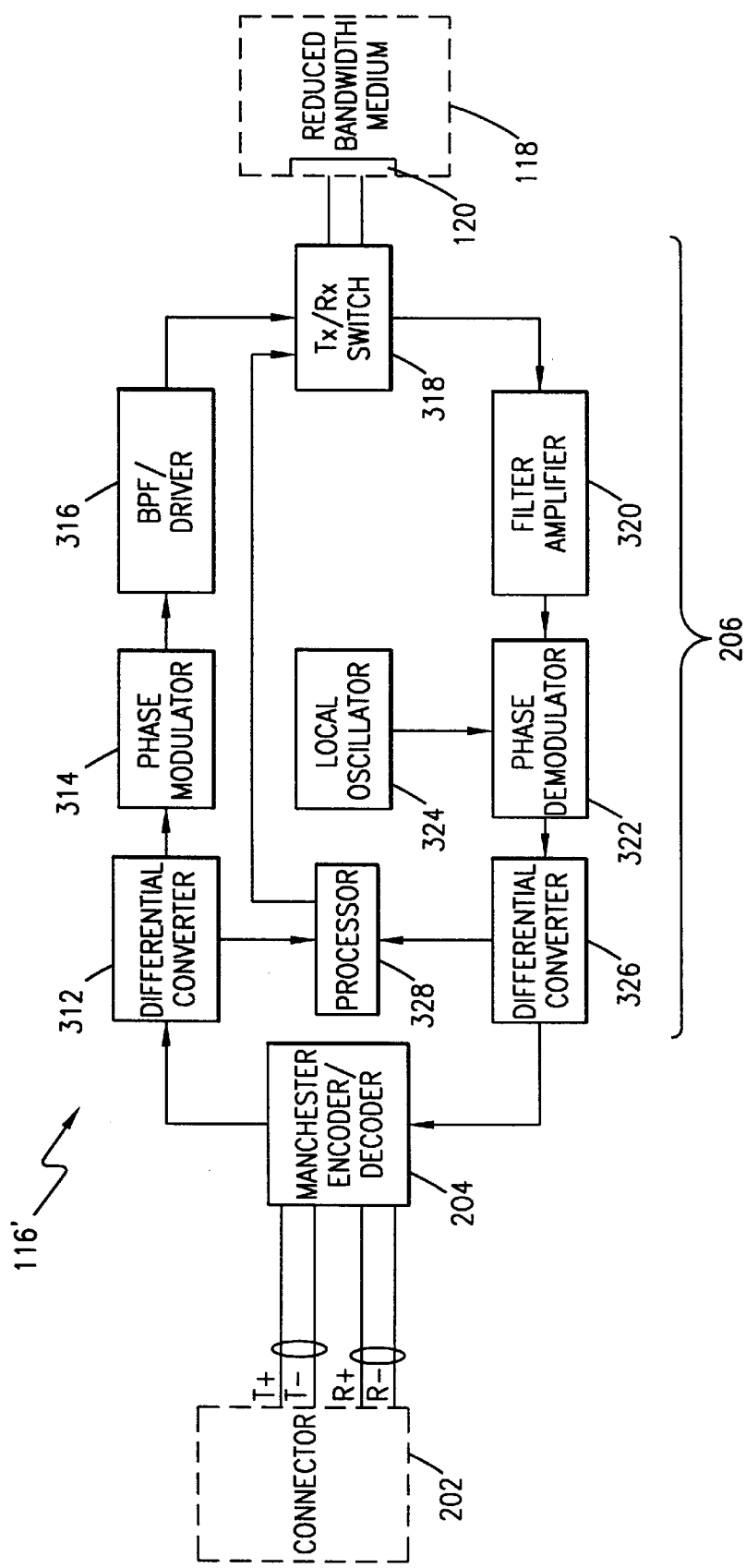
FIG. 3 depicts a block diagram of a converter, for example, as employed in the exemplary home environment of FIG. 1, wherein the reduced bandwidth communication resource includes a single twisted pair wire and the converter includes a Manchester encoder/decoder and a differential phase modulating/demodulating transceiver, in accordance with certain preferred embodiments of the present invention.

By way of further example, a converter 116', in accordance with certain preferred embodiments of the present invention, is depicted in the block diagram of FIG. 3.

Converter 116' includes a connector 202, a Manchester encoder/decoder 204, a differential converter 312, a phase modulator 314, a bandpass filter/driver 316, a transmit/receive switch 318, a filter/amplifier 320, a phase demodulator 322, a local oscillator 324, a differential converter 326, and a control processor 328.

As shown, converter 116' is configured to be operatively coupled between NIC 114 and a phone jack 120 of reduced bandwidth medium 118, which in this exemplary embodiment includes a single twisted pair wire. In this example, it is preferred that NIC 114 be a conventional 10 BASE-T NIC.

The operation of converter 116' will now be described. Converter 116' is selectively operable in two modes, a transmit mode (for outgoing data) and a receive mode (for incoming data). Because Ethernet employs CSMA/CD protocols, the default mode of converter 116' is the receive mode. If outgoing encoded data is to be transmitted by NIC 114 to converter 116', then converter 116' will switch to transmit mode provided that no other data signals are sensed on the twisted pair wire. This can be accomplished for example by carrier sensor and control logic implemented within processor 328 or additional logic circuitry (not shown). If no other data signals are sensed on the twisted pair wire, then processor 328 switches transmit/receive switch 318 into a transmit position.

As mentioned above, a 10 BASE-T NIC 114 requires two twisted pair wires. The first twisted pair wire, having conductors T+ and T-, is used for transmitting outgoing encoded data. The second twisted pair wire, having conductors R+ and R-, is used for receiving incoming encoded data. The outgoing encoded data has been encoded by NIC 114 using a Manchester line code. The outgoing encoded data received from NIC 114 over twisted pair wire T+ and T- is received by encoder/decoder 204 in the form of two differential data signals. Encoder/decoder 204 decodes the outgoing encoded data and provides corresponding outgoing decoded data to differential convertor 312.

The outgoing decoded data received from encoder/decoder 204 is then differentially converted by differential convertor 312, i.e., the differential signal pair associated with the outgoing decoded data are converted into a single outgoing decoded data signal.

This single outgoing decoded data signal is then provided to phase modulator 314. Phase modulator 314 modulates the signal to a radio frequency (RF) signal using a phase modulation scheme, such as, for example, differential binary phase shift keying (DBPSK), or differential quadrature phase shift keying (DQPSK).

Although good results have been achieved with carriers having a center frequency of between about 70–200 MHz for DBPSK, or a center frequency between about 10–70 MHz for DQPSK, it is contemplated that the present invention is not limited to these center frequencies or these frequency ranges. For example, in certain embodiments, the carrier can have a center frequency anywhere between about 1 and about 280 MHz depending upon the modulation scheme and the expense of the communication system.

These various modulation schemes and frequencies allow the data to be communicated over the twisted pair wire for limited distances, preferably within home environment 110, without being interfered with or interfering with other plain old telephone system (POTS) and/or xDSL signals that may be transmitted, simultaneously, over the twisted pair wire.

Although the converter 116' employs phase modulation, other types of modulation techniques can be employed, such as, for example, multiple carrier modulation (MCM) techniques or quadrature amplitude modulation (QAM) techniques. When QAM techniques are employed, for example, the carrier signal can have a center frequency as low as about 10 MHz and, in certain embodiments, as low as about 1 MHz. It is further recognized that the modulating process can be embodied in circuitry/processors in analog, digital, software, or any combination thereof.

Once modulated, the outgoing decoded data signal is then provided to bandpass filter/driver 316, which essentially limits the bandwidth of the signal. The outgoing decoded data signal is also amplified by a line driver within bandpass filter/driver 316. Preferably, the outgoing decoded data signal is adjusted to better match the impedance and/or other electrical properties associated with the twisted pair wire and/or reduced bandwidth communication medium 118.

Next, the outgoing decoded data signal is then passed through switch 318 and eventually applied to the twisted pair wire within reduced bandwidth medium 118.

When the carrier sense and control logic functions within processor 328 determines that NIC 114 has completed transmitting the outgoing data, switch 318 will be placed back into the receive mode.

In receive mode, the incoming decoded data signal from the twisted pair wire of medium 118 is bandpass filtered and amplified by filter/amplifier 320. The resulting incoming decoded data signal is then demodulated by phase demodulator 322 using a corresponding phase demodulation scheme and a reference timing signal from local oscillator 324. The incoming decoded data signal is then differentially converted with differential converter 326 from a single signal to a differential signal pair. The differential signal pair is then re-encoded using encoder/decoder 204 to regenerate the incoming encoded data as originally sent by the sending NIC 114 (e.g., see FIG. 1). This incoming encoded data is then provided to the receiving NIC 114 over twisted pair wire R+ and R-, through connector 202.

As described above, the carrier sense and control logic functions in processor 328 are used to determine when it is necessary to change switch 318 between transmit and receive positions. Processor 328 is also configured to control other functions, including, for example, the differential decoding and encoding performed by differential converters 312 and 326 as well as clock recovery using local oscillator 324.

Those skilled in the art will recognize that the teachings of the present invention, as described through the exemplary embodiments above, provides methods and arrangements that enables a potentially higher data rate signal to be transmitted over a reduced bandwidth medium, without losing data, introducing significant latencies, and/or interfering with other contemporary and/or simultaneous uses of the twisted pair wire in home environment 110.

Although certain embodiments in accordance with the present invention, are depicted in the accompanying Drawings and described in the foregoing text, it should be understood that the invention is not limited to the embodiments disclosed, but is capable of numerous rearrangements, modifications and substitutions without departing from the spirit of the invention as set forth and defined by the following claims.

What is claimed is:

1. A network arrangement comprising:
   a data communication medium;
   a first device configured to output encoded data;
   a decoder configured to receive the encoded data and output corresponding decoded data therefrom;

a transmitter configured to receive the decoded data and transmit the decoded data over the data communication medium;

a receiver configured to receive the decoded data over the data communication medium and output the decoded data;

an encoder configured to receive the decoded data from the receiver and regenerate the encoded data therefrom;

a second device configured to receive the encoded data from the encoder;

wherein the encoded data has a first data rate and the decoded data has a second data rate that is less than the first data rate; and wherein the data communication medium has a data rate that is less than the first data rate.

2. The network arrangement as recited in claim 1, wherein the encoded data includes return-to-zero (RTZ) data.

3. The network arrangement as recited in claim 2, wherein the RTZ data includes Manchester encoded data.

4. The network arrangement as recited in claim 2, wherein the decoded data includes non-return-to-zero (NRZ) data.

5. The network arrangement as recited in claim 4, wherein the decoder is further configured to convert the RTZ data into the NRZ data.

6. The network arrangement as recited in claim 4, wherein the encoder is further configured to convert the NRZ data into the RTZ data.

7. The network arrangement as recited in claim 4, wherein the transmitter is further configured to modulate the NRZ data and the receiver is further configured to demodulate the NRZ data.

8. The network arrangement as recited in claim 1, wherein the data communication medium includes at least one twisted pair wire.

9. A method for transferring information from a first device to a second device over a data communication medium, the method comprising:

receiving information from the first device as encoded data;

decoding the encoded data to produce decoded data;

transmitting the decoded data via the data communication medium;

receiving the decoded data via the data communication medium; then regenerating the decoded data;

encoding the decoded data to reproduce the encoded data;

providing the encoded data to the second device;

wherein the encoded data has a first data rate and the decoded data has a second data rate that is less than the first data rate.

10. The method as recited in claim 9, wherein the encoded data includes return-to-zero (RTZ) data and the step of decoding the encoded data further includes converting the RTZ data to non-return-to-zero (NRZ) data.

11. The method as recited in claim 10, wherein the step of encoding the decoded data further includes converting the NRZ data to the RTZ data.

12. The method as recited in claim 10, wherein the RTZ data includes Manchester encoded data.

13. The method as recited in claim 9, wherein the step of transmitting the decoded data further includes modulating the decoded data, and the step of receiving the decoded data further includes demodulating the transmitted data.

14. The method as recited in claim 9, wherein the step of transmitting the decoded data further includes transmitting the decoded data through at least one twisted pair wire within the data communication medium.

15. A converter for use in connecting a computing resource requiring a bandwidth for data communication with a data communication medium having a bandwidth smaller than the bandwidth required by the computer resource, the converter comprising:

an encoder/decoder configured to receive outgoing return-to-zero (RTZ) data requiring a first bandwidth from the computing resource and convert the outgoing RTZ data to outgoing non-return-to-zero (NRZ) data requiring a bandwidth less that the first bandwidth;

a transceiver configured to receive the outgoing NRZ data from the encoder/decoder and transmit the outgoing NRZ data over the data communication medium having a bandwidth less than the first bandwidth.

16. The converter as recited in claim 15, wherein:

said transceiver further configured to receive incoming NRZ data from the data communication medium; and said encoder/decoder further configured to receive incoming NRZ data from the transceiver and convert the incoming NRZ data into incoming RTZ data to be passed to the computing resource.

17. The interface arrangement as recited in claim 15, wherein both the incoming and outgoing RTZ data include Manchester encoded data.

* * * * *